US006812637B2

(12) United States Patent
Cok et al.

(10) Patent No.: US 6,812,637 B2
(45) Date of Patent: Nov. 2, 2004

(54) OLED DISPLAY WITH AUXILIARY ELECTRODE

(75) Inventors: Ronald S. Cok, Rochester, NY (US); Andrew D. Arnold, Hilton, NY (US); Dustin Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 48 days.

(21) Appl. No.: 10/388,111

(22) Filed: Mar. 13, 2003

(65) Prior Publication Data

US 2004/0178722 A1 Sep. 16, 2004

(51) Int. Cl.[7] .................................................. H01J 1/62
(52) U.S. Cl. ........................................ 313/503; 313/506
(58) Field of Search ........................ 313/498, 503, 313/506, 512

(56) References Cited

U.S. PATENT DOCUMENTS 6,246,179 B1  6/2001  Yamada
6,268,295 B1  7/2001  Ohta et al.
6,281,634 B1  8/2001  Yokoyama
6,731,064 B2 *  5/2004  Andry et al. ............... 313/506

FOREIGN PATENT DOCUMENTS

JP    11-162634     6/1999
JP    2001-126864   5/2001
WO    WO 00/36665   6/2000

OTHER PUBLICATIONS

U.S. patent application Publication 2002/00121783A1, by Hosokawa, published Jan. 31, 2002.

* cited by examiner

*Primary Examiner*—Vip Patel
(74) *Attorney, Agent, or Firm*—Thomas H. Close

(57) ABSTRACT

A top emitting OLED display includes a substrate; a patterned electrode formed above the substrate, defining a plurality of light emitting elements having gaps between the light emitting elements; a layer of OLED material disposed above the patterned electrode; a continuous transparent electrode disposed above the layer of OLED material; and a light-absorbing auxiliary electrode that is thermally and electrically conductive and in electrical and thermal contact with the continuous transparent electrode and located over the gaps between the light emitting elements of the display.

34 Claims, 4 Drawing Sheets

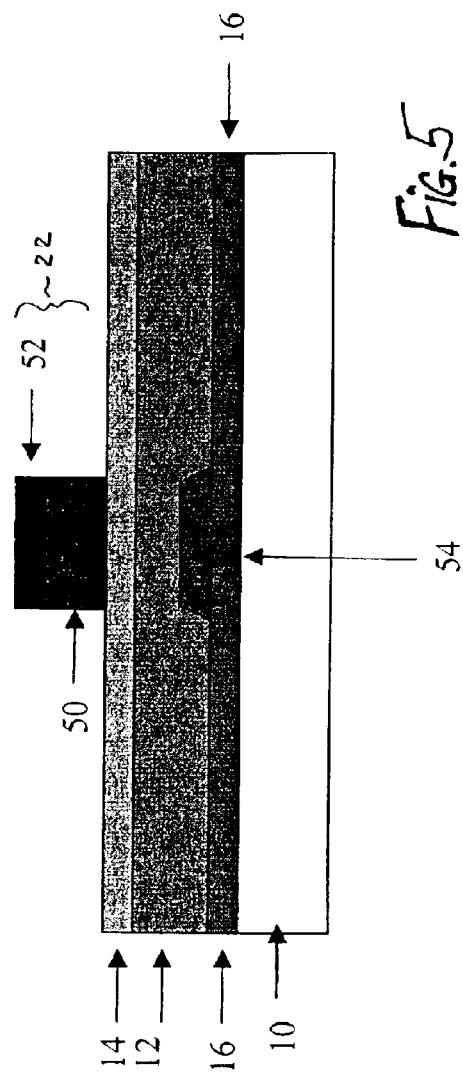
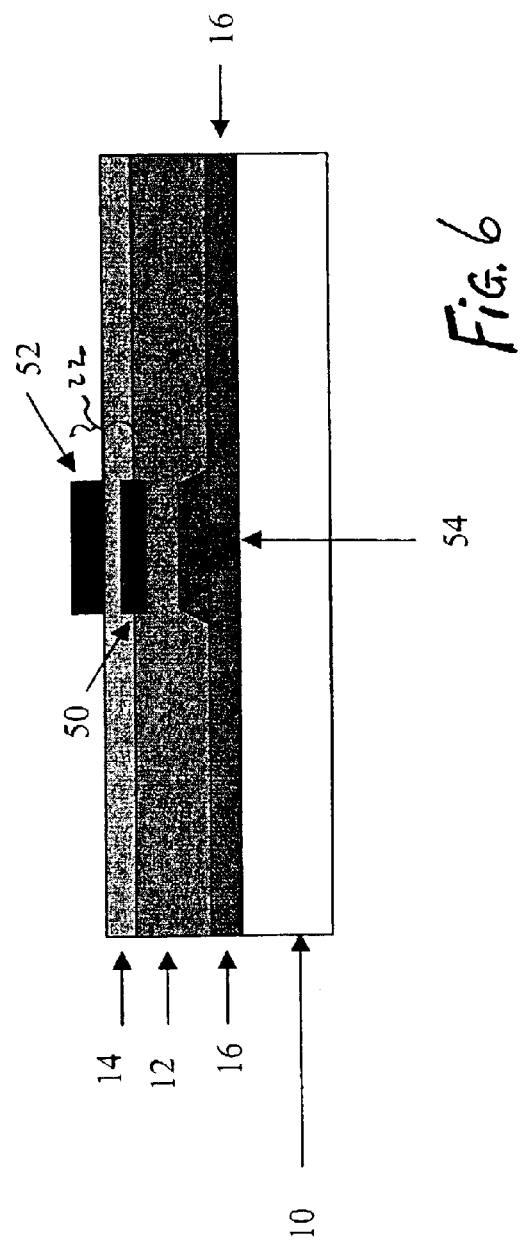

OLED DISPLAY WITH AUXILIARY ELECTRODE

FIELD OF THE INVENTION

The present invention relates to organic light emitting diode (OLED) displays having a plurality of pixels, and more particularly, to top-emitting displays that include an auxiliary electrode for improving the conductivity of a transparent continuous electrode in the display.

BACKGROUND OF THE INVENTION

Flat-panel displays, such as organic light emitting diode (OLED) displays, of various sizes are proposed for use in many computing and communication applications. In its simplest form, an OLED is comprised of an anode for hole injection, a cathode for electron injection, and an organic medium sandwiched between these electrodes to support charge recombination that yields emission of light. OLED displays may be constructed to emit light through a transparent substrate (commonly referred to as a bottom emitting display), or through a transparent top electrode on the top of the display (commonly referred to as a top emitting display).

Materials for forming the transparent electrode of top emitting displays are well known in the art and include transparent conductive oxides (TCO's), such as indium tin oxide (ITO); thin layers of metal, such as Al, having a thickness on the order of 20 nm; and conductive polymers such as polythiophene. However, many electrode materials that are transparent, such as ITO, have low conductivity, which results in a voltage drop across the display. This in turn causes variable light output from the light emitting elements in the display, resistive heating, and power loss. Resistance can be lowered by increasing the thickness of the top electrode, but this decreases transparency.

One proposed solution to this problem is to use an auxiliary electrode above or below the transparent electrode layer and located between the pixels, as taught by US2002/0011783, published Jan. 31, 2002, by Hosokawa. The auxiliary electrode is not required to be transparent and therefore can be of a higher conductivity than the transparent electrode. The auxiliary electrode is typically constructed of conductive metals (Al, Ag, Cu, Au) that are also highly reflective. This results in incident light reflecting off the auxiliary electrode and thereby reducing the overall contrast ratio of the display. This makes the display less effective for use under high ambient light conditions, such as outdoors under sunshine.

There is a need therefore for an improved top emitting OLED display that uses an auxiliary electrode and has improved contrast.

SUMMARY OF THE INVENTION

The need is met according to the present invention by providing a top emitting OLED display that includes a substrate; a patterned electrode formed above the substrate, defining a plurality of light emitting elements having gaps between the light emitting elements; a layer of OLED material disposed above the patterned electrode; a continuous transparent electrode disposed above the layer of OLED material; and a light-absorbing auxiliary electrode that is thermally and electrically conductive and in electrical and thermal contact with the continuous transparent electrode and located over the gaps between the light emitting elements of the display.

ADVANTAGES

This invention has the advantage over other top emission devices having auxiliary electrodes of improved contrast and heat dissipation and therefore improved usability in bright ambient conditions such as in sunlight

BRIEF DESCRIPTION OF THE DRAWINGS

FIG. 5 is a partial cross sectional schematic diagram of an OLED display device according to a further alternative embodiment of the present invention;

FIG. 6 is a partial cross sectional schematic diagram of an OLED display device according to still further alternative embodiment of the present invention.

It will be understood that the figures are not to scale since the individual layers are too thin and the thickness differences of various layers too great to permit depiction to scale.

DETAILED DESCRIPTION OF THE INVENTION

Figure 1:
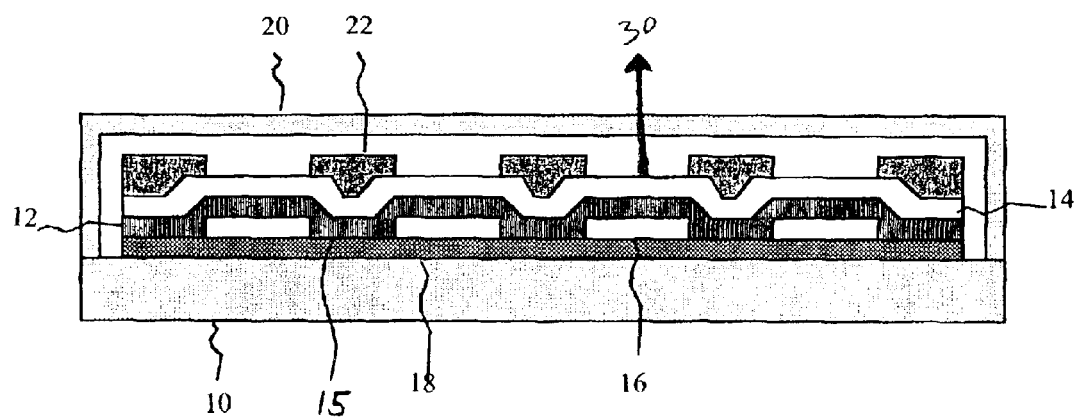
FIG. 1 is a cross sectional schematic diagram of an OLED display device according to one embodiment of the present invention.

Referring to FIG. 1 a top-emitting OLED display device according to the present invention includes a substrate 10 with an encapsulating cover 20. Thin-film transistor (TFT) circuitry 18 is located on the substrate 10, and a patterned electrode 16 covering a portion of the substrate is located above the TFT layer 18. This patterned electrode 16 defines the light emitting elements of the OLED display and gaps 15 between the light emitting elements. A layer of OLED light emissive materials 12 is coated over most of the display. The layer of OLED materials 12 may comprise a variety of materials to emit different colors of light and may be patterned over the substrate to provide a colored display. The layer of OLED light emissive materials 12 is composed of a plurality of layers such as hole injection and electron transport layers as is known in the art. A continuous transparent electrode layer 14 is coated over most of the display. A light absorbing auxiliary electrode 22 that is thermally and electrically conductive is located over the gaps between the light emitting areas in electrical and thermal contact with the continuous transparent electrode layer 14. The light absorbing auxiliary electrode 22 may be precisely aligned with the gaps 15 as shown in FIG. 1, or may be less precisely aligned. The auxiliary electrode 22 may also be wider than the gaps to accommodate the less-precise alignment. As used herein the term "located over the gaps" means located near the gaps and at least partially overlapping the gaps. An optional electrode protection layer (not shown) may be provided over the electrodes 14 and 22.

In operation, the TFT circuitry 18 controls current passing through the patterned electrode 16, the OLED light emissive materials 12, and the transparent electrode 14. Light 30 is emitted from the areas defined by the patterned electrode 16 and is not emitted from the gaps between the light emitting elements. In one embodiment, the patterned electrode 16 is reflective so that any light emitted toward the substrate 10 is reflected out of the display.

The TFT circuitry 18 includes power bus lines for conducting current. The current passes through the patterned electrode 16, the layer of OLED light emissive materials 12, and the continuous transparent electrode 14, causing resistive heating in both the TFT circuitry 18 and in the electrodes and layer of OLED light emissive materials 14, 16, and 12. The light absorbing auxiliary electrode 22 conducts current as part of the transparent electrode 14 thereby reducing the sheet resistivity of the transparent electrode 14 and reducing the resistive heating. Moreover, because the auxiliary electrode 22 is thermally conductive, the heat generated in the layer of OLED light emissive materials 12 is distributed through the auxiliary electrode 22, thereby reducing hot spots in the display. This combined effect of reducing resistivity and increasing thermal conductivity reduces both the overall heat produced in the device and the heat in the OLED light emissive layer. Hence, brightness and/or lifetime of the OLED display device may be increased. The sharpness of the display is also improved because unwanted, emitted light that might otherwise be internally reflected within the layers of the display device may be absorbed by the auxiliary electrode 22.

Since any ambient light incident on the display between the light emissive portions of the display is absorbed by the light absorbing auxiliary electrode, the ambient contrast of the display is also increased according to the present invention. As shown in FIG. 1, the transparent electrode 14 may conform to the surface on which it is deposited. Planarization layers may be included to modify the surface regularity of the display. The light absorbing auxiliary electrode 22 may conform as desired to the surface of the transparent electrode. The transparent electrode 14 allows light to pass through.

Figure 2:
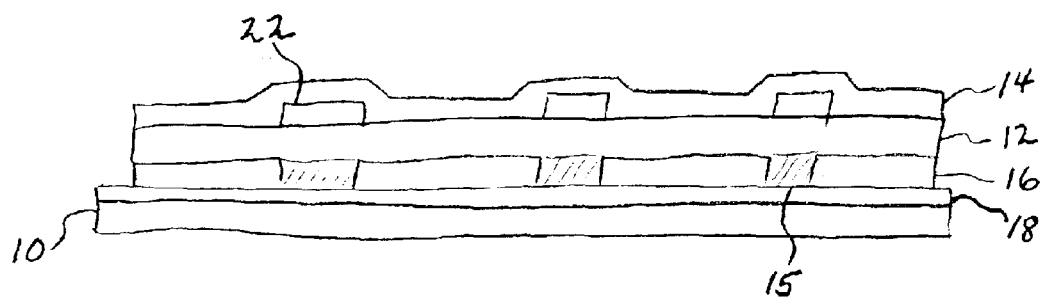
FIG. 2 is a partial cross sectional schematic diagram of an OLED display device according to another embodiment of the present invention.

Referring to FIG. 2, the light absorbing auxiliary electrode 22 may be located beneath the transparent electrode 14 above the gaps 15 defined by the patterned electrode 16.

The present invention may also be employed to improve a microcavity OLED display wherein the transparent electrode 14 provides a partial mirror for the microcavity.

Figure 3:
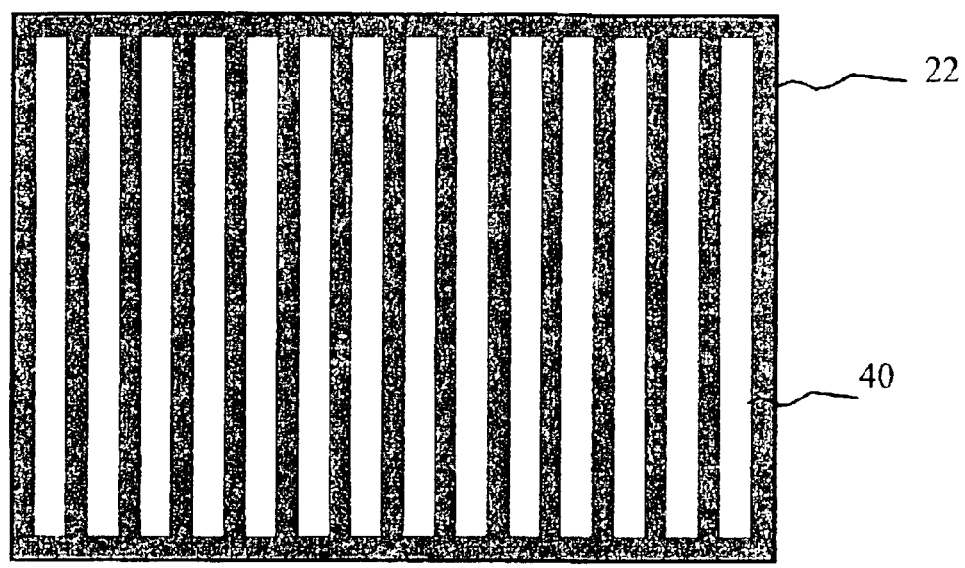
FIG. 3 is a plan view of an auxiliary electrode according to one embodiment of the present invention.

Referring to FIG. 3, one type of OLED display includes columns 40 of light emitting pixels, with no substantial non light emitting spaces between the pixels in a column. For this configuration, the light absorbing auxiliary electrodes 22 define a vertical stripe between the columns 40 of light emitting pixels. Successive columns 40 of light emitting pixels may be of different colors, for example, repeated columns of red, green, and blue. Alternatively, the display may be laid out in rows.

Figure 4:
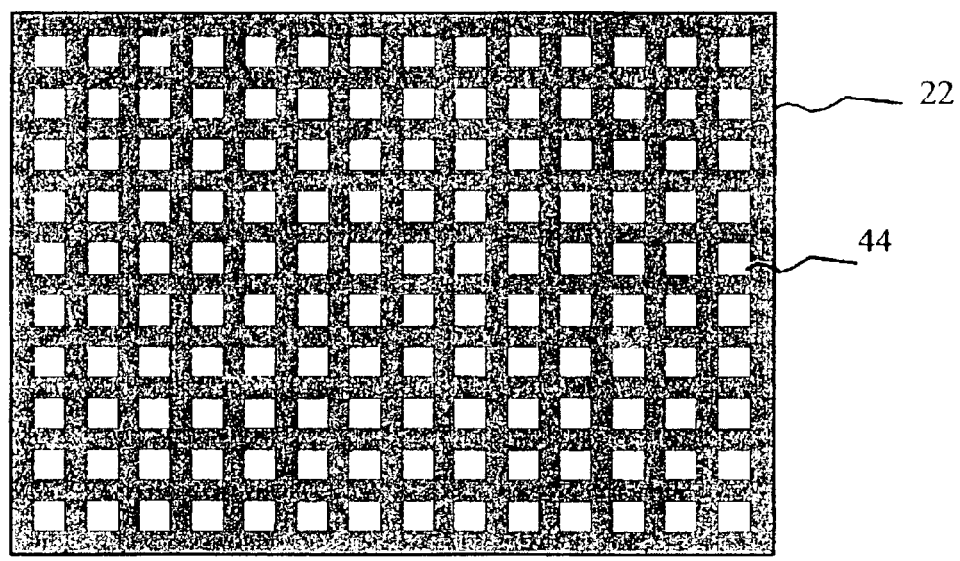
FIG. 4 is a plan view of an auxiliary electrode according to another embodiment of the present invention.

Referring to FIG. 4, another type of OLED display includes a two dimensional array of light emitting pixels 44, with non light emitting spaces surrounding each light emitting pixel 44. For this configuration, the light absorbing auxiliary electrodes 22 define a grid structure. Other arrangements, such as delta patterns, may also be used.

In one embodiment, the light absorbing and conductive material forming the auxiliary electrodes 22 is a black silver compound. Silver is a highly thermally and electrically conductive material and can be made light absorbing through electrochemical processes known in the art; for example, it can be oxidized and reduced. Photographic processes may also be used. The deposition and patterning process for the light absorbing auxiliary electrode 22 is done through the use of conventional photo-resistive processes.

Silver compounds are suggested in the prior art as candidates for the electrode 14, for example magnesium silver compounds, thereby improving the chemical compatibility of the electrode and the thick film of light absorbing auxiliary electrode 22. Other suitable materials may include aluminum, copper, magnesium, titanium, or alloys thereof.

In a further embodiment of the present invention, the light absorber may be provided with desiccating properties, thereby improving the lifetime of the organic layers.

Referring to FIG. 5, in an alternative embodiment, the light absorbing and conductive material comprises two layers, a thermally and electrically conductive auxiliary electrode 50 and a light-absorbing layer 52 deposited over the conductive layer. The gap between the patterned electrodes 16 is filled with an insulator 54.

Referring to FIG. 6, in another alternative embodiment, the light absorbing and conductive material comprises two layers, a thermally and electrically conductive auxiliary electrode 50 deposited beneath the electrode 14 and a light-absorbing layer 52 deposited over the conductive layer 14. The gap between the patterned electrodes 16 is filled with an insulator 54. Suitable conductive materials may include aluminum, copper, magnesium, silver, titanium, or alloys thereof The light absorbing layer may include a metal oxide, metal sulfide, silicon oxide, silicon nitride, carbon, or combinations thereof. Preferably, the light absorbing material is black and may include further anti-reflective coatings.

Figure 7:
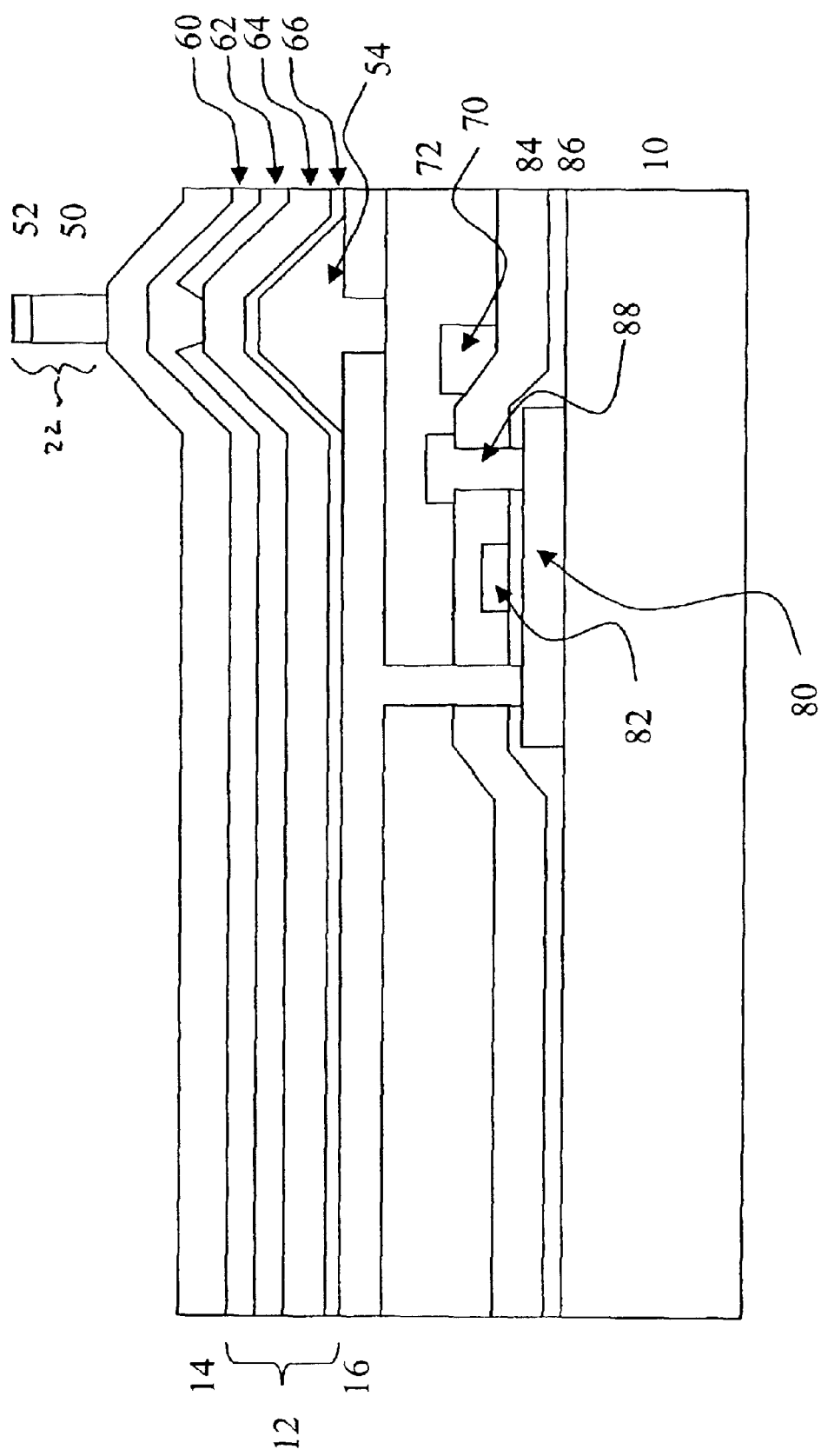
FIG. 7 is a more detailed partial cross sectional schematic diagram of the OLED display device shown FIG. 5.

Referring to FIG. 7, a cross-section of a portion of an OLED display according to the present invention is shown in more detail. The display is constructed as follows. Over the substrate 10, a semiconducting layer 80 is formed, doped, and patterned. A gate insulating layer 86 is formed over the semiconductor layer. Over the gate insulating layer, a gate conductor 82 is formed. Typical materials used to form the gate insulating layer are silicon dioxide or silicon nitride. The semiconductor layer is then doped to form source and drain regions on either sides of the gate (not shown). An interlayer insulator layer 84 is formed over the gate conductor layer. Typical materials used to form the interlayer insulator layer are silicon dioxide or silicon nitride.

Over the interlayer insulator layer 84, a conductor layer is deposited and patterned forming the power lines 88 and the data lines 70. An interlayer insulator layer 72 is formed over the conductor layer. The interlayer insulator layer 72 preferably is a layer of planarizing material which smoothes the device topography. Over the interlayer insulator layer, the electrode 16 of the organic light emitting elements is formed. These electrodes are patterned to define the light emitting elements.

For a top emitting display (i.e. a display that emits light from the side of the substrate on which the OLEDs are located), the electrode 16 is typically formed of a material which is both conductive and reflective, such as for example, aluminum (Al), silver (Ag), or molybdenum (Mo), gold (Au), or platinum (Pt). Around the edges of the electrodes, an inter-pixel insulating film 54 is formed to reduce shorts between the anode and the cathode. Use of such insulating films over the electrode is disclosed in U.S. Pat. No. 6,246,179, issued Jun. 12, 2001 to Yamada. While use of the inter-pixel insulating film is preferred, it is not required for successful implementation of the invention.

The organic light emitting layers 12 are deposited over the electrode 16. There are numerous organic EL layer structures known in the art wherein the present invention can be employed. A common configuration of the organic light emitting layers is employed in the preferred embodiment consisting of a hole injecting layer 66, a hole transporting layer 64, an emitting layer 62, and an electron transporting layer 60. As is shown in FIG. 7, the emitting layer 62 is the only layer that requires patterning between pixels according to the technique taught in U.S. Pat. No. 6,281,634, issued Aug. 28, 2001 to Yokoyama.

The electrode 14 is located over the organic light emitting layers. In a top emitter configuration, the electrode 14 is transparent and conductive. The most common materials used for the electrode is indium tin oxide (ITO) or indium zinc oxide (IZO) or a thin metal layer such as Al, Mg, or Ag which is preferably between 5 nm and 20 nm in thickness. While one layer is shown for the electrode 14, multiple sub-layers can be combined to achieve the desired level of conductance and transparency such as an ITO layer and an Al layer. The electrode 14 is common to all pixels and does not require precision alignment and patterning.

The light absorbing properties of the device may be enhanced by the use of color filter arrays above the light emitting elements and the light absorbing areas. The composition and deposition of such filters is well-known in the art.

The conductive and/or light absorbing layers may be deposited using techniques such as sputtering through a shadow mask. In one embodiment, the same shadow mask is used for depositing both a conductive layer and a light absorbing layer. Alternatively, the electrically and thermally conductive electrode and light absorbing layer may be deposited, patterned, and etched using a single photolithography mask step. Deposition for the conductive and/or light absorbing layers may also be done using a thermal transfer process from a donor substrate.

The present invention may be applied to both active and passive matrix OLED displays. Planarization and/or electrode protection layers may be placed over or under the light absorbing auxiliary electrode 22. When provided, the protection layer may comprise inorganic materials such as SiOx or SiNx, for example, as disclosed in JP 2001126864. Alternatively, the protection layer may comprise organic materials such as polymers, including but not limited to, TEFLON®, polyimides, and polymers disclosed in JP 11-162634. Protection layer may comprise multiple layers of organic or inorganic materials, or combinations thereof. Alternating inorganic and organic layers, for example, as disclosed in U.S. Pat. No. 6,268,2951, issued Jul. 31, 2001 to Ohta et al., and WO 00/36665, by Graff et al., published Jun. 22, 2000, are useful as protection layer. In all cases, the protection layer should have high optical transparency, preferably greater than 70% transmittance.

Applicants have demonstrated the deposition of a thick film of black silver using electroplating and chemical reduction techniques known in the art. The thick film of light absorbing material 22 may also be deposited in a pattern using photolithographic techniques known in the art. For example, light absorbing material may be coated as a liquid on the entire surface and exposed to radiation through a mask to polymerize portions of the coating. Portions of the material exposed to the radiation are cured and the remainder is washed away. Dry film photolithography may also be used. In addition, patterned thermal transfer can be used, for example, by coating material onto a donor substrate, placing the donor substrate in contact with or in close proximity to the OLED substrate, and selectively heating the donor with a laser to cause transfer of the light absorbing material to the OLED substrate. The light absorbing auxiliary electrode 22 may comprise a plurality of thinner layers deposited by sequential deposition of light absorbing materials. Alternatively, the light absorbing auxiliary electrode 22 may be a thick film and may be deposited using screen printing methods. A light absorbing auxiliary electrode may also be provided around the perimeter of the display to further increase the contrast of the display device and conductivity of the electrode 14.

A color OLED display may be provided by an array of light emitting materials 12 that emit different colors of light. Alternatively, the color OLED display may be provided by a white-light emitting OLED layer together with an array of color filters to provide a color display. In this embodiment, color filter materials may be deposited above the light absorbing auxiliary electrode 22, as well as above the light emissive areas defined by the electrode 14. In addition, a light absorbing filter may be deposited over the light absorbing auxiliary electrode 22 to enhance the light absorption.

While transparent cover 20 is typically glass or plastic sheet, the cover can comprise materials that are deposited in a conformable manner over the surface of the materials deposited over the substrate, i.e. over OLED substrate and the light absorbing auxiliary electrode and any electrode protection layer.

This invention can be advantageously practiced with active or passive matrix OLED display devices.

The invention has been described in detail with particular reference to certain preferred embodiments thereof, but it will be understood that variations and modifications can be effected within the spirit and scope of the invention.

PARTS LIST 10 substrate
12 OLED light emissive materials
14 electrode
15 gap
16 electrode
18 TFT circuitry
20 encapsulating cover
22 auxiliary electrode
30 light
40 columns
44 light emitting pixel
50 thermally and electrically conductive auxiliary electrode
52 light absorbing layer
54 inter-pixel insulating film
60 electron transporting layer
62 emitting layer
64 hole transporting layer
66 hole injecting layer
70 data line
72 insulator layer
80 semiconducting layer
82 conductor
84 interlayer insulator layer
86 insulating layer
88 power line

What is claimed is:

1. A top emitting OLED display, comprising:
    a) a substrate;
    b) a patterned electrode formed above the substrate, defining a plurality of light emitting elements having gaps between the light emitting elements;
    c) a layer of OLED material disposed above the patterned electrode;
    d) a continuous transparent electrode disposed above the layer of OLED material; and e) a light-absorbing auxiliary electrode that is thermally and electrically conductive and in electrical and thermal contact with the continuous transparent electrode and located over the gaps between the light emitting elements of the display.

2. The OLED display claimed in claim 1, wherein the display is an active-matrix display, and further comprising a layer of active-matrix circuitry formed on the substrate under the patterned electrode.

3. The OLED display claimed in claim 1, wherein the display is a passive-matrix display, and further comprising a layer of conductors formed on the substrate for making electrical connection to the patterned electrode.

4. The OLED display claimed in claim 1, wherein the auxiliary electrode is located below the transparent electrode.

5. The OLED display claimed in claim 1, wherein the auxiliary electrode is located above the transparent electrode.

6. The OLED display claimed in claim 1, wherein the auxiliary electrode comprises a uniform light-absorbing material that is thermally and electrically conductive.

7. The OLED display claimed in claim 5, wherein the auxiliary electrode comprises a thermally and electrically conductive material and a thermally conductive light-absorbing layer.

8. The OLED display claimed in claim 7, where the thermally and electrically conductive layer is located below the transparent electrode and the light absorbing layer is located above the transparent electrode.

9. The OLED display claimed in claim 1, wherein the auxiliary electrode comprises light absorbing silver.

10. The OLED display claimed in claim 7, wherein the electrically and thermally conductive layer is comprised of aluminum, copper, magnesium, molybdenum, silver, titanium, or alloys thereof.

11. The OLED display claimed in claim 7, wherein the thermally conductive light-absorbing material comprises a metal oxide, silicon oxide, silicon nitride, carbon, a metal sulfide or combinations thereof.

12. The OLED display claimed in claim 1, further comprising a color filter array located above the transparent electrode.

13. The OLED display claimed in claim 1, wherein the light absorbing auxiliary electrode is black.

14. The OLED display claimed in claim 1, further comprising an anti-reflective coating located over the light absorbing auxiliary electrode.

15. A method of making a light emitting OLED display, comprising the steps of:
a) providing a substrate;
b) forming a patterned electrode above the substrate, defining a plurality of light emitting elements having gaps between the light emitting elements;
c) disposing a layer of OLED material above the patterned electrode;
d) disposing a continuous transparent electrode above the layer of OLED material; and
e) locating a light-absorbing auxiliary electrode that is thermally and electrically conductive and in electrical and thermal contact with the continuous transparent electrode over the gaps between the light emitting elements of the display.

16. The method claimed in claim 14, wherein the display is an active-matrix display, and further comprising the step of forming a layer of active-matrix circuitry on the substrate under the patterned electrode.

17. The method claimed in claim 14, wherein the display is a passive-matrix display, and further comprising the step of forming a layer of conductors on the substrate for making electrical connection to the patterned electrode.

18. The method claimed in claim 14, wherein the auxiliary electrode is located below the transparent electrode.

19. The method claimed in claim 14, wherein the auxiliary electrode is located above the transparent electrode.

20. The method claimed in claim 14, wherein the auxiliary electrode comprises a uniform light-absorbing material that is thermally and electrically conductive.

21. The method claimed in claim 19, wherein the auxiliary electrode comprises a thermally and electrically conductive material coated with a thermally conductive light-absorbing layer.

22. The method claimed in claim 14, wherein the auxiliary electrode comprises light absorbing silver.

23. The method claimed in claim 21, wherein the electrically and thermally conductive layer is comprised of aluminum, copper, magnesium, molybdenum, silver, titanium, or alloys thereof.

24. The method claimed in claim 21, wherein the thermally conductive light-absorbing material comprises a metal oxide, silicon oxide, silicon nitride, carbon, a metal sulfide or combinations thereof.

25. The method claimed in claim 14, further comprising the step of forming a color filter array above the transparent electrode.

26. The method claimed in claim 14, wherein the light absorbing auxiliary electrode is black.

27. The method claimed in claim 14, further comprising an anti-reflective coating located over the light absorbing auxiliary electrode.

28. The method claimed in claim 14, wherein the auxiliary electrode is sputtered.

29. The method of claim 14, further comprising the steps of providing an electrically and thermally conductive layer and a light-absorbing layer.

30. The method claimed in claim 28, wherein the electrically and thermally conductive electrode and light-absorbing layer of the auxiliary electrode are sputtered in two steps with a single shadow mask.

31. The method claimed in claim 14, wherein photolithographic processes are used to form the light-absorbing auxiliary electrode.

32. The method claimed in claim 20, wherein the thermally and electrically conductive material and the thermally conductive light-absorbing layer are deposited and then patterned and etched using a single photolithography mask step.

33. The method claimed in claim 14, wherein the auxiliary electrode is deposited using a thermal transfer process from a donor substrate.

34. The method claimed in claim 20, wherein the thermally conductive light absorbing layer is deposited using a thermal transfer process from a donor substrate.

* * * * *